United States Patent
Tsubota

(10) Patent No.: US 9,974,191 B2
(45) Date of Patent: May 15, 2018

(54) METHOD OF MANUFACTURING SEMICONDUCTOR DEVICE, SUBSTRATE PROCESSING APPARATUS AND RECORDING MEDIUM

(71) Applicant: HITACHI KOKUSAI ELECTRIC INC., Tokyo (JP)

(72) Inventor: Yasutoshi Tsubota, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 291 days.

(21) Appl. No.: 14/805,506

(22) Filed: Jul. 22, 2015

(65) Prior Publication Data

US 2015/0334849 A1 Nov. 19, 2015

Related U.S. Application Data

(63) Continuation of application No. PCT/JP2014/051060, filed on Jan. 21, 2014.

(30) Foreign Application Priority Data

Jan. 24, 2013 (JP) .................................. 2013-011376

(51) Int. Cl.
*B23K 1/00* (2006.01)
*H05K 3/34* (2006.01)
(Continued)

(52) U.S. Cl.
CPC .......... *H05K 3/3494* (2013.01); *B23K 1/0016* (2013.01); *B23K 1/012* (2013.01);
(Continued)

(58) Field of Classification Search
CPC .... B23K 1/008; B23K 35/383; B23K 1/0016; B23K 1/012
(Continued)

(56) References Cited

U.S. PATENT DOCUMENTS

| 2005/0173057 A1* | 8/2005 | Suga | ................... B32B 38/0008 |
|---|---|---|---|
| | | | 156/273.3 |
| 2011/0318918 A1 | 12/2011 | Kitamura | |
| 2012/0111925 A1* | 5/2012 | Diep | ..................... B23K 1/0016 |
| | | | 228/178 |

FOREIGN PATENT DOCUMENTS

| EP | 0628370 A1 * | 12/1994 | ............ B23K 3/085 |
|---|---|---|---|
| JP | 11-154785 A | 6/1999 | |

(Continued)

*Primary Examiner* — Erin B Saad
(74) *Attorney, Agent, or Firm* — Volpe and Koenig, P.C.

(57) ABSTRACT

Manufacturing quality of a semiconductor device can be improved, and manufacturing throughput can be improved. A method of manufacturing a semiconductor device includes (a) placing a substrate on a substrate supporting unit installed in a processing chamber, the substrate having thereon a solder with an oxygen-containing film on a surface thereof, (b) reducing the oxygen-containing film by supplying a reducing gas into the processing chamber while maintaining a thermal conductivity of an inner atmosphere of the processing chamber at a first thermal conductivity, and (c) melting the solder by supplying a thermally conductive gas into the processing chamber while maintaining the thermal conductivity of the inner atmosphere of the processing chamber at a second thermal conductivity higher than the first thermal conductivity.

11 Claims, 10 Drawing Sheets

(51) Int. Cl.
  *B23K 3/04* (2006.01)
  *B23K 3/08* (2006.01)
  *B23K 3/06* (2006.01)
  *B23K 1/012* (2006.01)
  *B23K 1/20* (2006.01)
  *H01L 21/02* (2006.01)
  *H01L 21/67* (2006.01)
  *H01L 23/00* (2006.01)

(52) U.S. Cl.
  CPC .............. *B23K 1/203* (2013.01); *B23K 1/206* (2013.01); *B23K 3/04* (2013.01); *B23K 3/06* (2013.01); *B23K 3/082* (2013.01); *H01L 21/02068* (2013.01); *H01L 21/67109* (2013.01); *H01L 21/67207* (2013.01); *H01L 24/11* (2013.01); *H01L 24/741* (2013.01); *H01L 2224/05022* (2013.01); *H01L 2224/05124* (2013.01); *H01L 2224/05572* (2013.01); *H01L 2224/05639* (2013.01); *H01L 2224/05644* (2013.01); *H01L 2224/05647* (2013.01); *H01L 2224/05655* (2013.01); *H01L 2224/11849* (2013.01); *H01L 2224/131* (2013.01); *H01L 2224/94* (2013.01); *H05K 2203/043* (2013.01); *H05K 2203/087* (2013.01); *H05K 2203/095* (2013.01)

(58) Field of Classification Search
  USPC ... 228/178, 42, 101, 123.1, 124.1, 205, 232, 228/8
  See application file for complete search history.

(56) References Cited

FOREIGN PATENT DOCUMENTS

| | | |
|---|---|---|
| JP | 2007-027346 A | 2/2007 |
| JP | 2012-009597 A | 1/2012 |

* cited by examiner

METHOD OF MANUFACTURING SEMICONDUCTOR DEVICE, SUBSTRATE PROCESSING APPARATUS AND RECORDING MEDIUM

CROSS-REFERENCE TO RELATED PATENT APPLICATION

This U.S. non-provisional patent application claims priority under 35 U.S.C. § 119 of PCT/JP2014-051060, filed on Jan. 21, 2014, in the World Intellectual Property Office, and Japanese Patent Application No. 2013-011376, filed on Jan. 24, 2013, in the Japanese Patent Office, the entire contents of which are hereby incorporated by reference.

BACKGROUND OF THE INVENTION

1. Field of the Invention

The present invention relates to a method of manufacturing a semiconductor device in which reflow processing of bumps is performed, a substrate processing apparatus and a recording medium.

2. Description of the Related Art

In recent times, in order to mount a semiconductor device with a high degree of integration, a reduction in size of a package of the semiconductor device has been required. Accordingly, an electrode and a lead frame of the semiconductor device are connected using a solder terminal having a convex shape, which is referred to as a bump. Since the semiconductor device and the lead frame may overlap to be connected using the bump, a space in a planar direction of the mounted substrate may be omitted. In addition, the bump is used when the semiconductor device and the lead frame are stacked, and is also used at a connection place in three-dimensional mounting of the semiconductor device using a through silicon via (TSV), which has been actively researched in recent times.

In general, the bump is formed by applying a solder onto an electrode using a paste printing method or a plating method after the electrode is formed on the semiconductor device. However, since fine unevenness occurs on a surface of a solder applied by the paste printing method or the plating method, when connection using the solder is performed in this state, air bubbles are introduced into the solder, and thus connecting strength or durability is decreased. In order to prevent this, heat treatment for planarizing the surface of the solder by previously heating the solder to a melting point or more to melt the solder is needed. The heat treatment is referred to as reflow.

Various methods of reflow are disclosed, and for example, in Japanese Unexamined Patent Application, First Publication No. 2012-9597 (hereinafter, referred to as Patent Literature 1), a method of removing a natural oxide film of a solder using plasma and melting the solder using radiation heat from a heater is disclosed.

PRIOR ART LITERATURE

Patent Literature

1. Japanese Unexamined Patent Application, First Publication No. 2012-9597

SUMMARY OF THE INVENTION

The present invention is directed to provide a method of manufacturing a semiconductor device, a substrate processing apparatus and a recording medium that are capable of improving manufacturing quality of the semiconductor device and improving manufacturing throughput.

According to an aspect of the present invention, there is provided a method of manufacturing a semiconductor device including: (a) placing a substrate on a substrate supporting unit installed in a processing chamber, the substrate having thereon a solder with an oxygen-containing film on a surface thereof; (b) reducing the oxygen-containing film by supplying a reducing gas into the processing chamber while maintaining a thermal conductivity of an inner atmosphere of the processing chamber at a first thermal conductivity; and (c) melting the solder by supplying a thermally conductive gas into the processing chamber while maintaining the thermal conductivity of the inner atmosphere of the processing chamber at a second thermal conductivity higher than the first thermal conductivity.

DETAILED DESCRIPTION OF THE PREFERRED EMBODIMENTS

Embodiment of the Invention

Hereinafter, an embodiment of the present invention will be described with reference to the accompanying drawings.

(1) Configuration of Substrate Processing Apparatus

Figure 1:
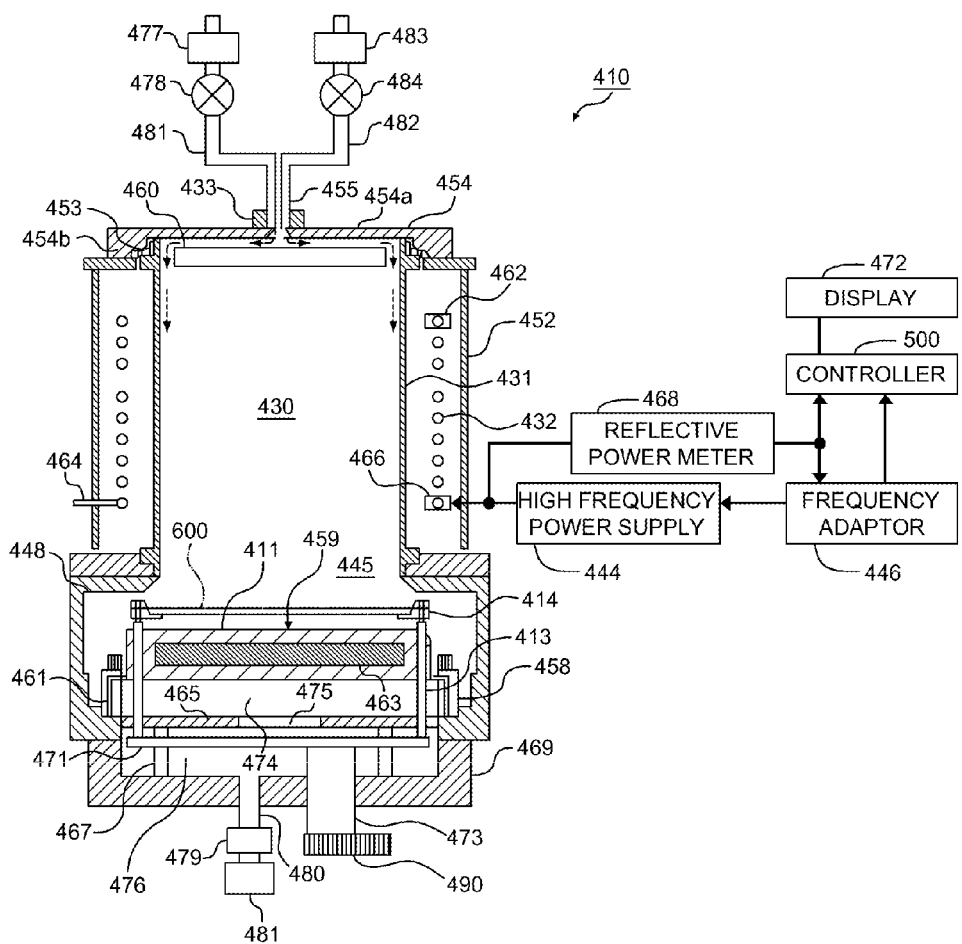
FIG. 1 is a view showing a configuration of a substrate processing apparatus according to an embodiment of the present invention.

First, a configuration example of a substrate processing apparatus for performing a method of manufacturing a semiconductor device according to the embodiment will be described with reference to FIG. 1. FIG. 1 is a cross-sectional configuration view of the substrate processing apparatus. Here, as an example of a plasma generating type, a high frequency non-electrode discharge type plasma processing apparatus is exemplarily described.

FIG. 1 shows a schematic configuration view of a processing apparatus 410. The processing apparatus 410 is constituted by a substrate supporting unit configured for a wafer 600 serving as a substrate (to be described below) to be placed thereon, a gas supply unit, an exciting unit configured to generate plasma in a processing container 431 (to be described below), and an exhaust unit.

(Substrate)

Figure 2A:
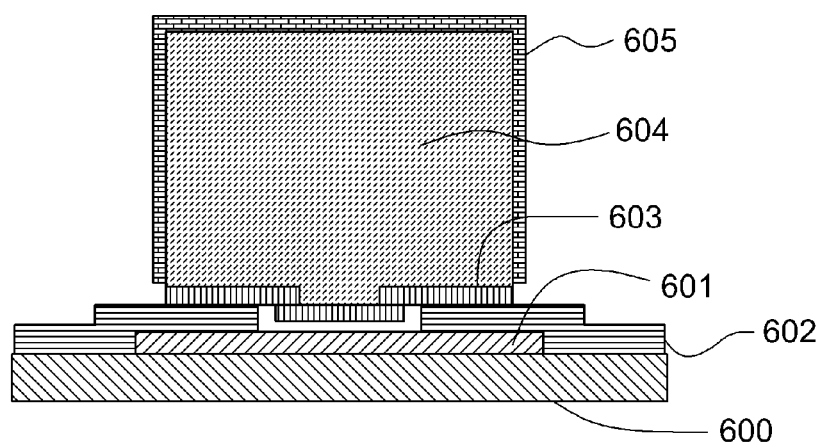
FIG. 2a is a view showing a configuration example of a substrate before processing according to the embodiment of the present invention.
Figure 2B:
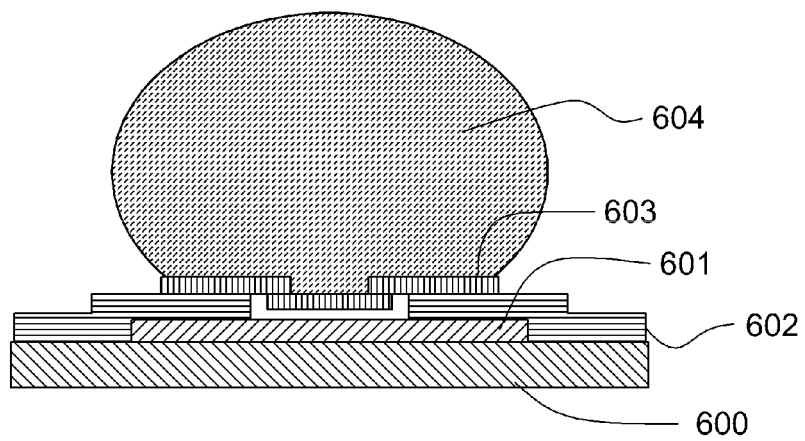
FIG. 2b is a view showing a configuration example of the substrate after the processing according to the embodiment of the present invention.
Figure 2C:
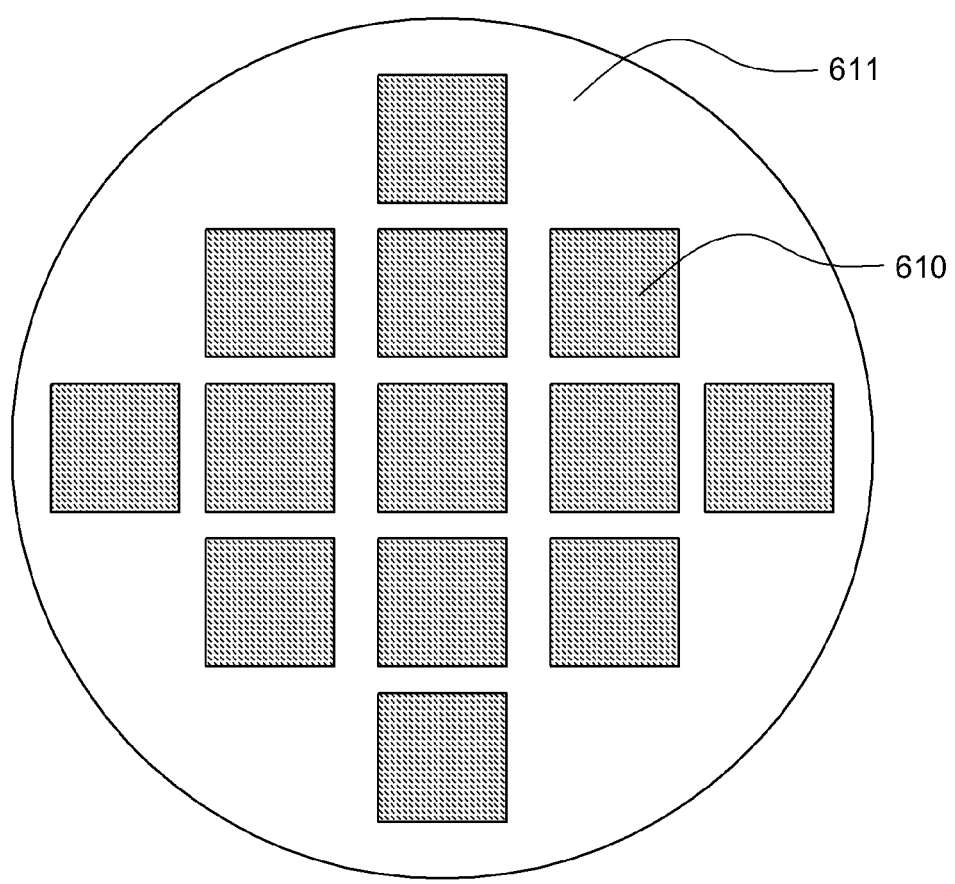
FIG. 2c is a view showing a configuration example of the substrate in a dice state according to the embodiment of the present invention.

As shown in FIG. 2a, an aluminum pad 601, an under-bump metal 602, a nickel (Ni) plate 603 and a bump (solder) 604 are formed at the wafer 600 serving as the substrate, and an oxide film 605 is formed on the solder 604. In addition, instead of the aluminum pad 601 or the Ni plate 603, a pad or a plate including Au, Ag, Cu and so on may be used. The oxide film 605 is formed in a process of removing a resist, and a process of conveying the wafer between the substrate processing apparatuses, which are performed after the bump 604 is formed. The inventors have found that the high quality solder can be formed and thermal stress applied to the substrate can be suppressed to a minimum level by performing an oxide layer removal process of removing a natural oxide film (to be described below) and a reflow process of the embodiment. In addition, the inventors have found that adjustment of a substrate temperature (to be described below) is effective when two different stacked substrates are processed. The two or more different substrates are, for example, an abraded silicon (Si) substrate, a support glass substrate and so on. While an adhesive agent or solder on the substrate needs be heated to a melting point or more in the reflow processing, an undesirable alloying reaction may occur in the soldering in the case of overheating. In addition, application of the stress to the heated substrate due to heat is unavoidable. When a large number of substrates are stacked by three-dimensional mounting, influence due to thermal stress cannot be ignored. In addition, in the substrate that employs the TSV technology, the substrate may be abraded to reduce a thickness of the Si substrate, and may be attached to a support glass by an adhesive agent. In this case, it is necessary to pay attention to delamination of the Si substrate and the support glass due to thermal stress and a heat-resistant temperature of the adhesive agent. In addition, at least one of the two or more different substrates may be in a dice state. The dice state is a state in which a plurality of dies 610 picked from a silicon wafer by a chip unit are placed on a support substrate 611 as shown in FIG. 2c. When the substrate in this state is processed, more precise temperature adjustment is needed. For example, when the support substrate 611 is irregularly heated, positions of the dies 610 placed on the support substrate 611 may be deviated, or a difference in temperature between the placed dies 610 may occur.

(Processing Chamber)

The processing container 431 is generally formed of quartz glass or ceramics, which are non-metal materials, in a cylindrical shape. An upper end of the processing container 431 is closed by a top plate 454, a lower end is closed by a base plate 448 and a bottom board 469, which are frames that are parallel to each other, and the processing container 431 is hermetically sealed by a pressure regulation mechanism (to be described below). A space opposite to a resonance coil 432 serving as an exciting unit (to be described below) disposed over the processing container 431 is a plasma generating chamber 430 in which plasma is generated. In addition, a space disposed under the resonance coil 432 serving as the exciting unit and at which the wafer 600 is placed is a processing chamber 445.

(Substrate Supporting Unit)

A susceptor 459 is installed at a bottom surface of the processing chamber 445. The susceptor 459 includes a susceptor table 411 and a substrate heating unit 463 configured to heat the wafer on the susceptor. In addition, the susceptor 459 has a structure supported by a plurality of columns 461. A plurality of lifter pins 413 passing through the susceptor table 411 are installed, and wafer support pins 414 are installed at upper sections of the lifter pins 413. The wafer support pins 414 extend in a central direction of the susceptor 459. The wafer 600 is placed on the susceptor table 411 or the wafer support pin 414. In addition, a heater 463 serving as a heating unit may be installed under the susceptor table 411 to heat the wafer 600. The substrate supporting unit is constituted by the wafer support pin 414. According to circumstances, the susceptor table 411 and the lifter pin 413 may be included. The lifter pin 413 is connected to an elevation board 471, and configured to elevate along a guide shaft 657 by an elevation driving unit 490.

(Exhaust Unit)

An exhaust unit is installed under the susceptor 459. The exhaust unit includes an auto pressure control (APC) valve 479 serving as a pressure regulation unit (a pressure regulation mechanism) and an exhaust pipe 480. According to circumstances, the exhaust unit may include an exhaust pump 481. An opening angle of the APC valve 479 is feedback-controlled based on the pressure in the processing chamber 445. The pressure in the processing chamber 445 is measured by a pressure sensor (not shown).

(Baffle Ring)

In addition, in order to improve the flow of the process gas, a cylindrical baffle ring 458 and an exhaust plate 465 may be installed. A plurality of ventilation holes are uniformly formed in a cylindrical side surface of the baffle ring 458, and an exhaust communication hole 475 is formed in a central section of the exhaust plate 465. A first exhaust chamber 474 is defined by the susceptor 459, the baffle ring 458 and the exhaust plate 465, a second exhaust chamber 476 is defined by the exhaust plate 465 and the bottom board 469, and the first exhaust chamber 474 comes in communication with the second exhaust chamber 476 via the exhaust communication hole 475. In addition, the exhaust pipe 480 comes in communication with the second exhaust chamber 476. As the first exhaust chamber 474 and the second exhaust chamber 476 are separately installed, uniform exhaust in the entire circumferential direction of the wafer 600 becomes possible, and thus processing uniformity of the wafer 600 can be improved.

(Gas Supply Unit)

Gas supply pipes 455 configured to supply a plurality of needed reactive gases through a gas supply facility are installed at a gas introduction port 433 of the top plate 454 on the processing container 431. A first gas supply unit configured to supply $N_2$ gas and a second gas supply unit configured to supply the other gases, here, $H_2$ gas, He gas or the like, are installed at the gas supply pipe 455. Mass flow controllers 477 and 483 serving as flow rate control units and opening/closing valves 478 and 484 are installed at the gas supply unit to control a gas supply amount. Here, while only the first and second gas supply units are provided, an additional gas supply unit such as a third gas supply unit or the like may be provided. In addition, gases to be used may be previously mixed and then flowed into the gas introduction port 433. In addition, a baffle plate 460 having a substantially circular shape and formed of quartz glass or ceramics is installed in the processing container 431 such that the reactive gas flows along an inner wall of the processing container 431. As a supply amount and an exhaust amount are adjusted by the flow rate control unit and the APC valve 479, pressures of the processing container 431 and the processing chamber 445 are controlled to desired values.

(Exciting Unit)

The resonance coil 432 serving as the exciting unit has a winding diameter, a winding pitch and a winding number, which are set to be resonated in a constant wavelength mode, to form standing waves having a predetermined wavelength. That is, an electrical length of the resonance coil 432 is set to a length corresponding to an integer (1, 2, . . . ) times one wavelength, a half wavelength or ¼ wavelength at a predetermined frequency of power supplied from a high frequency power supply 444. For example, in the case of 27.12 MHz, the wavelength is about 11 m. The lengths of the used frequency and the resonance coil 432 may be set by a desired plasma generating state, a mechanical dimension of the plasma generating chamber 430 or the like.

More specifically, the resonance coil 432 has an effective cross-sectional area of 50 $mm^2$ to 300 $mm^2$ and a coil diameter of 200 mm to 500 mm, and is wound at an outer circumferential side of the processing container 431 2 to 60 times such that a magnetic field of about 0.01 gausses to 10 gausses is generated by a high frequency power of, for example, 800 kHz to 50 MHz or 0.5 kW to 5 kW in consideration of applied power, generated magnetic field intensity, appearance of an applied apparatus, or the like. A material that constitutes the resonance coil 432 may be a copper pipe, a copper thin plate, an aluminum pipe, an aluminum thin plate, a member in which a copper plate or aluminum is deposited on a polymer belt or the like. The resonance coil 432 is formed of an insulating material in a flat plate shape, and supported at an upper end surface of the base plate 448 by a plurality of supporting units, which are vertically formed.

While both ends of the resonance coil 432 are electrically grounded, at least one end of the resonance coil 432 is grounded via a movable tab 462 to finely adjust the electrical length of the resonance coil 432 upon initial installation of the apparatus or change of the processing conditions. For example, the resonance coil 432 is grounded by a fixed ground place 464. In addition, in order to finely adjust impedance of the resonance coil 432 upon initial installation of the apparatus or change of the processing conditions, a power feeding unit is configured by a movable tab 466 between both grounded ends of the resonance coil 432.

That is, the resonance coil 432 includes ground sections, which are electrically grounded, at both ends thereof, and also includes a power feeding unit disposed between the ground sections to receive power from the high frequency power supply 444. In addition, at least one ground section may be a position-adjustable variable ground section, and the power feeding unit may be a position-adjustable variable power feeding unit. When the resonance coil 432 includes the variable ground section and the variable power feeding unit, as will be described below, the resonance frequency and the load impedance of the plasma generating chamber 430 can be more easily adjusted.

In addition, a waveform adjustment circuit constituted by a coil and a shield may be inserted into one end (or both ends) of the resonance coil 432 such that a phase current and a reverse phase current symmetrically flow about an electrical center of the resonance coil 432. The waveform adjustment circuit is configured as an open circuit as the ends of the resonance coil 432 are set to an electrical non-connection state or an electrically equivalent state. In addition, the ends of the resonance coil 432 may be directly connected to a fixed reference voltage in a non-grounded state by a choke serial resistor.

An outer shield 452 is installed to shield a leakage of electromagnetic waves to the outside of the resonance coil 432 and form a capacity element required to configure a resonance circuit between the resonance coils 432. The outer shield 452 is generally formed of a conductive material such as an aluminum alloy, copper, a copper alloy or the like in a cylindrical shape. The outer shield 452 is disposed to be isolated from the outer circumference of the resonance coil 432 by, for example, about 5 mm to 10 mm. In addition, generally, while the outer shield 452 is grounded such that both ends of the resonance coil 432 become equal to an electric potential, one end or both ends of the outer shield 452 may be configured to adjust a tab position to precisely set a resonance number of the resonance coil 432, or a trimming capacitance may be inserted between the resonance coil 432 and the outer shield 452. In addition, a spiral resonator may be constituted by the outer shield 452 and the resonance coil that are electrically grounded.

An appropriate power supply such as an RF generator or the like may be used as the high frequency power supply 444 as long as a power supply can supply power having a voltage and a frequency required for the resonance coil 432. For example, a high frequency power supply that can supply power having a frequency of about 80 kHz to 800 MHz or 0.5 kW to 5 kW is used.

In addition, a reflective power meter 468 is installed at an output side of the high frequency power supply 444, and reflective wave power detected by the reflective power meter 468 is input to a controller 500 serving as a control unit. The controller 500 performs not only control of the high frequency power supply 444 but also the entire control of the substrate processing apparatus including operations or the like of a substrate conveyance mechanism or a gate valve. A display 472 serving as a display device displays data detected by various detection units installed at the substrate processing apparatus, for example, detection results of reflective waves by the reflective power meter 468 or the like. In addition, a frequency adaptor 446 configured to control a transmitting frequency is installed at the high frequency power supply 444.

In the embodiment, while the exciting unit is constituted by the resonance coil 432, the exciting unit may further include at least one of the high frequency power supply 444, the outer shield 452, the reflective power meter 468 and the frequency adaptor 446.

(Substrate Conveyance System)

Figure 3:
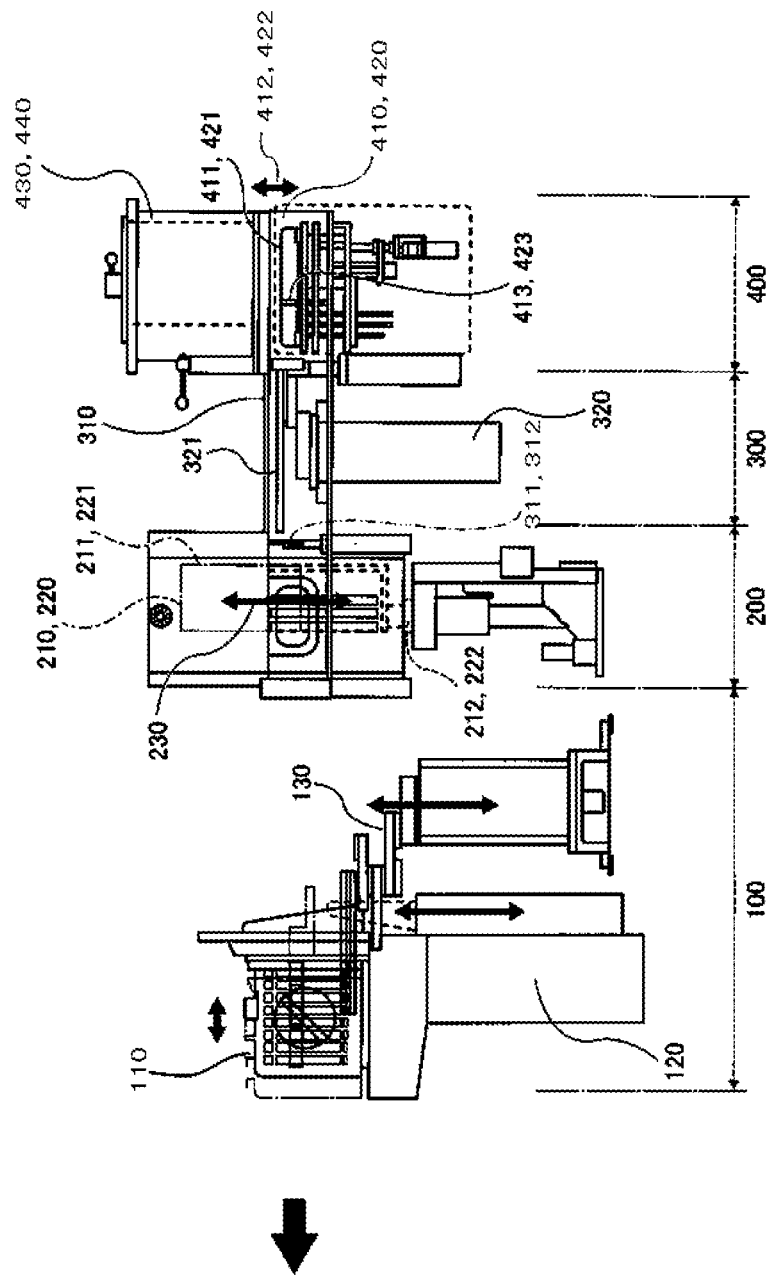
FIG. 3 is a side cross-sectional view showing a configuration example of a conveyance system according to the embodiment of the present invention.
Figure 4:
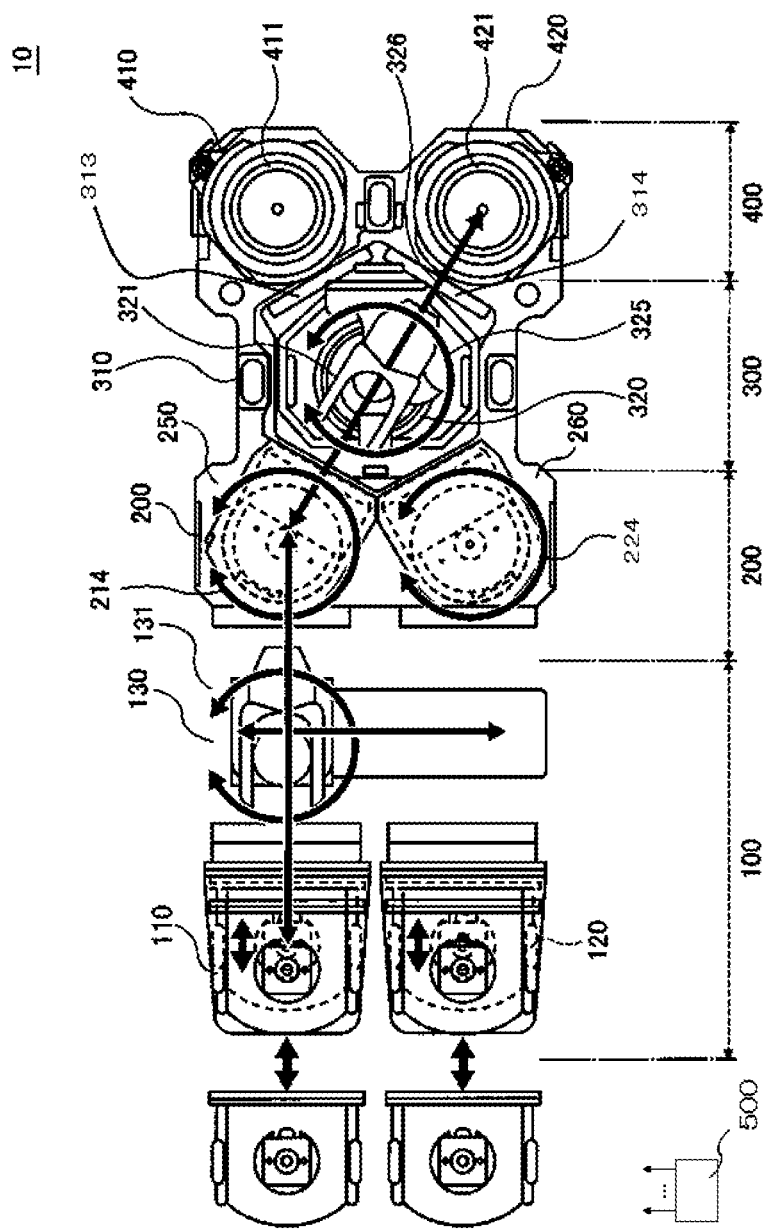
FIG. 4 is a top cross-sectional view showing a configuration example of a conveyance system according to the embodiment of the present invention.

Next, the conveyance system of the substrate of the embodiment will be described with reference to FIGS. 3 and 4. The conveyance system configured to convey the substrate includes an equipment front end module (EFEM) 100, a load lock chamber unit 200 and a transfer module unit 300.

The EFEM 100 includes front opening unified pods (FOUPs) 110 and 120 and a standby conveyance robot 130 serving as a first conveyance unit configured to convey the wafers from the FOUPs to a load lock chamber. 25 wafers are mounted on the FOUPs, and an arm unit of the standby conveyance robot 130 discharges 5 wafers at a time from the FOUPs.

The load lock chamber unit 200 includes load lock chambers 250 and 260 and buffer units 210 and 220 configured to hold the wafers 600 conveyed from the FOUPs in the load lock chambers 250 and 260, respectively. The buffer units 210 and 220 include boats 211 and 221 and index assemblies 212 and 222 under the boats 211 and 221. The boat 211 (221) and the index assembly 212 (222) thereunder are simultaneously rotated by a θ shaft 214 (224). The inside of the load lock chamber unit 200 may be a vacuum atmosphere, an inert gas atmosphere or a decompression atmosphere in which an inert gas is supplied.

The transfer module unit 300 includes a transfer module 310 used as a conveyance chamber, and the load lock chambers 250 and 260 are installed at the transfer module 310 via gate valves 311 and 312. A vacuum arm robot unit 320 used as a second conveyance unit is installed at the transfer module 310. In addition, the inside of the transfer module unit 300 may be a vacuum atmosphere, an inert gas atmosphere or a decompression atmosphere in which an inert gas is supplied. In order to suppress adsorption of unnecessary oxygen to the wafer 600 while improving the conveyance throughput of the wafer 600, the inside of the load lock chamber unit 200 and the inside of the transfer module unit 300 may be the decompression atmosphere in which the inert gas is supplied.

A process chamber unit 400 includes plasma processing units 410 and 420 used as the processing chambers, and plasma generating chambers 430 and 440 installed over the plasma processing units 410 and 420. The plasma processing units 410 and 420 are installed at the transfer module 310 via gate valves 313 and 314. Here, the plasma processing unit 420 has a similar configuration to the unit 410.

(Controller)

The controller 500 controls the above-mentioned parts to perform a substrate processing process, which will be described below.

(Control Unit)

Figure 5:
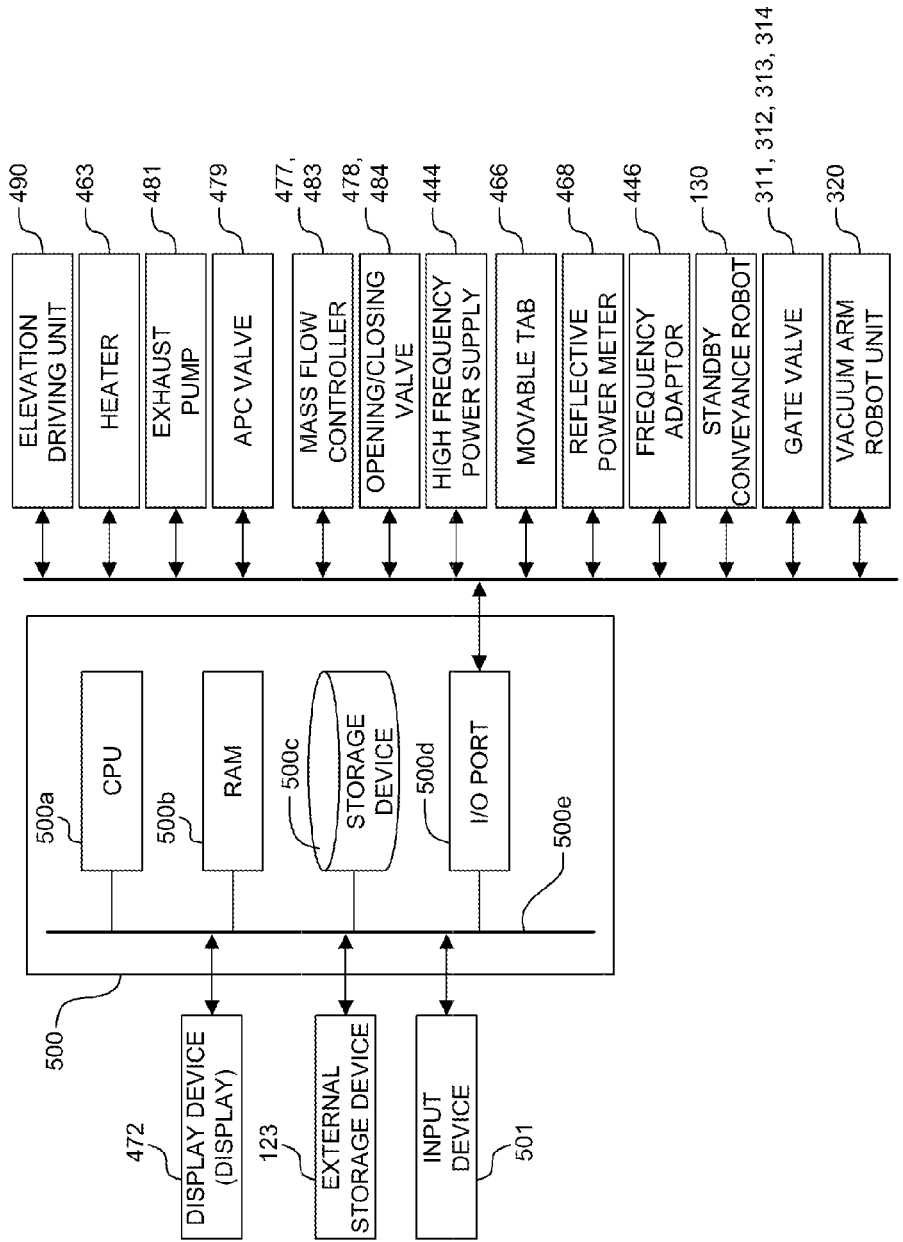
FIG. 5 is a view showing a structure example of a controller according to the embodiment of the present invention.

As shown in FIG. 5, the controller 500 serving as a control unit (a control means) is configured as a computer including a central processing unit (CPU) 500a, a random access memory (RAM) 500b, a storage device 500c and an I/O port 500d. The RAM 500b, the storage device 500c and the I/O port 500d are configured to exchange data with the CPU 500a via an internal bus 500e. An input/output device 501 constituted by, for example, a touch panel or the like is connected to the controller 500.

The storage device 500c is constituted by, for example, a flash memory, a hard disk drive (HDD) or the like. A control program for controlling an operation of the substrate processing apparatus, a process recipe in which a sequence or conditions of substrate processing (to be described below) are written, or the like, is stored in the storage device 500c. In addition, the process recipe is combined to obtain a predetermined result by performing the sequences in the substrate processing process by the controller 500 (to be described below), and functions as a program. Hereinafter, the process recipe, the control program or the like is generally and simply referred to as a program. In addition, when the term "program" is used herein, the program may include only the process recipe, only the control program, or both of these. In addition, the RAM 500b is configured as a memory region (a work area) in which the program, data or the like read by the CPU 500a is temporarily held.

The I/O port 500d is connected to the elevation driving unit 490, the heater 463, the APC valve 479, the mass flow controllers 477 and 483, the opening/closing valves 478 and 484, the high frequency power supply 444, the movable tab 466, the reflective power meter 468, the frequency adaptor 446, the exhaust pump 481, the standby conveyance robot 130, the gate valves 313 and 314, the vacuum arm robot unit 320 and so on.

The CPU 500a is configured to read and perform the control program from the storage device 500c, and read the process recipe from the storage device 500c according to input or the like of a manipulation command from the input/output device 501. In addition, the CPU 500a is configured to control a vertical moving operation of the lifter pin 413 by the elevation driving unit 490, a heating operation of the wafer 600 by the heater 463, a pressure regulation operation by the APC valve 479, a flow rate regulation operation of the process gas by the mass flow controllers 477 and 483 and the opening/closing valves 478 and 484, a high frequency power supply operation by the high frequency power supply 444, a measurement operation of reflective wave power by the reflective power meter 468, a frequency matching operation by the frequency adaptor 446, and so on according to contents of the read process recipe. In addition, adjustment of positions of the movable tabs 462 and 466 may be automated to control the fine impedance regulation operation of the resonance coil 432 by the CPU 500a.

In addition, the controller 500 is not limited to a dedicated computer but may be constituted by a general-purpose computer. For example, the controller 500 according to the embodiment may be configured by preparing an external storage device 123 in which the above-mentioned program is stored (for example, a magnetic tape, a magnetic disk such as a flexible disk, a hard disk or the like, an optical disc such as CD, DVD or the like, an optical magnetic disc such as an MO, a semiconductor memory such as a USB memory (USB flash drive), a memory card or the like), and installing the program in the general-purpose computer using the external storage device 123. In addition, a means configured to supply a program to the computer is not limited to the case in which the program is supplied via the external storage device 123. For example, the program may be supplied using a communication means such as the Internet or an exclusive line without the external storage device 123. In addition, the storage device 500c or the external storage device 123 is constituted by a non-transitory computer-readable recording medium. Hereinafter, these are generally and simply referred to as recording media. Further, the term "recording medium" used in the description may include only the storage device 500c, only the external storage device 123, or both of these.

(2) Substrate Processing Process

Figure 6:
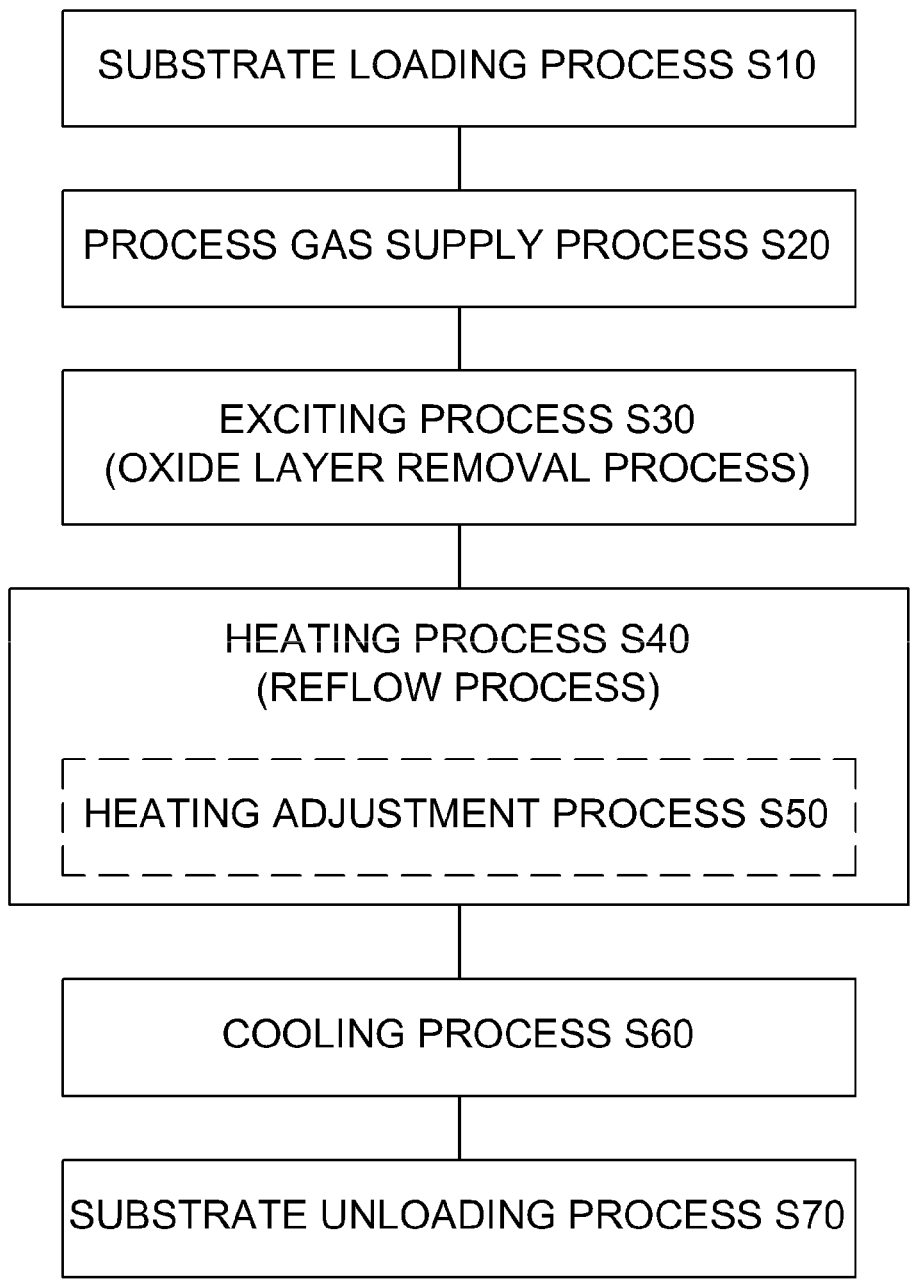
FIG. 6 is a view showing a flow example of a substrate processing process according to the embodiment of the present invention.

Next, the substrate processing process performed as a process of a semiconductor manufacturing process according to the embodiment will be described with reference to FIG. 6. The process is performed by the above-mentioned substrate processing apparatus. In addition, in the following description, operations of the parts that constitute the substrate processing apparatus are controlled by the controller 500.

Substrate Loading Process (S10)

First, the wafer 600 is conveyed from the FOUP 110 to the load lock chamber 250 by the standby conveyance robot 130. Vacuum exhaust is performed in the load lock chamber 250 to be substituted from an air atmosphere or inert gas atmosphere in the EFEM to the vacuum atmosphere, the inert gas atmosphere or the decompression atmosphere in which the inert gas is supplied. When substitution of the atmosphere is terminated, the gate valve 311 disposed between the load lock chamber 250 and the transfer module 310 is opened, and the wafer 600 is conveyed from the load lock chamber 250 to the transfer module 310 by the vacuum arm robot unit 320. When the wafer 600 is conveyed, the gate valve 311 is closed. Then, the wafer 600 is placed on the wafer support pin 414 on the lifter pin 413 through the gate valve 313 installed between the transfer module 310 and the plasma processing unit 410. When the wafer conveyance mechanism is withdrawn to the outside of the processing chamber 445, the gate valve 313 is closed. Upon conveyance of the wafer 600, the conveyance path may be purged by the inert gas in the decompression state. As the atmosphere becomes the inert gas atmosphere and becomes decompressed, oxidation (adsorption of oxygen) of the semiconductor device or the solder formed on the wafer 600 can be suppressed.

Next, the lifter pin 413 is lowered to move the wafer 600 such that a distance between the wafer 600 on the susceptor table 411 (a front end of the lifter pin 413) and the susceptor table 411 becomes a predetermined first distance. The first distance is a distance $L_1$ larger than a second distance (to be described below). For example, the first distance is 10 mm to 20 mm. Here, elevation of the lifter pin 413 is performed by the elevation driving unit 490. The heater 463 installed at the susceptor 459 is previously heated, and heats the wafer 600 to a predetermined wafer temperature within a range of room temperature to 100° C. In the embodiment, the wafer temperature is maintained under 100° C. in the oxide layer removal process (to be described below), and then the wafer temperature is increased to a temperature at which the solder on the substrate is melted in the reflow process. In addition, the wafer 600 may be placed on the susceptor table 411. When the wafer 600 is placed on the susceptor table 411, a gap may be formed between the wafer 600 and the susceptor table 411 while a back surface of the wafer 600 comes in point contact with the susceptor table 411 other than in contact with the entire back surface.

Process Gas Supply Process (S20)

Next, a predetermined process gas is supplied through the gas supply pipe 455. A gas having a reducing property in a plasma state is used as the process gas. For example, at least one of hydrogen ($H_2$) gas, ammonia ($NH_3$) gas and carbon monoxide (CO) gas is used as the process gas. In addition, an inert gas or a rare gas may be mixed within a range in which the oxide layer removal process (to be described below) is not disturbed. In the embodiment, an example using $H_2$ gas is provided. In addition, as the exhaust amount is adjusted by the APC valve 479, the pressure in the processing chamber 445 is maintained at a predetermined pressure within a range of about 1 Pa to 1,330 Pa. For example, the pressure is maintained at 100 Pa. A gas flow rate is set to a predetermined flow rate within a range of about 0.1 SLM to 10 SLM. For example, the gas flow rate is set to 5 SLM. In addition, according to necessity, a predetermined gas may be supplied after the atmosphere gas in the processing container 431 and the processing chamber 445 is exhausted.

Exciting Process (S30) (Oxide Layer Removal Process)

When the gas flow rate and the pressure are set to desired set values, high frequency power is applied to the resonance coil 432 from the high frequency power supply 444 to excite the process gas to generate plasma. The applied power is a predetermined power within a range of about 0.5 kW to 5 kW. For example, the applied power is 1 kW. Predetermined processing is performed on the wafer 600 by the generated plasma for a predetermined time. In the embodiment, hydrogen plasma is generated as the reducing plasma, and removal processing of the oxide layer formed on the wafer 600 is performed.

Heating Process (S40) (Reflow Process)

When the oxide layer removal process is performed on the wafer 600 for the predetermined time, application of the high frequency power to the resonance coil 432 is stopped. In addition, supply of the process gas is stopped, and supply of a reflow gas is started. The reflow gas may be a gas having a non-corrosive property and good conductivity, for example, hydrogen ($H_2$) gas, helium (He) gas or the like. In addition, the process may be simplified using the inert gas. When the reflow gas is supplied, vacuum exhaust may be performed one time. Next, the lifter pin 413 is lowered such that the distance between the wafer 600 (the front end of the lifter pin 413) and the susceptor table 411 becomes a second distance $L_2$ smaller than the first distance to thereby heat the wafer 600 to a predetermined temperature. The second distance is a predetermined distance of 0.5 mm to 5 mm. For example, the second distance is 2.5 mm. The temperature of the wafer 600 is heated to a temperature higher than a melting point of the solder and lower than a heat-resistant upper limit temperature of the substrate. For example, the wafer is heated to a temperature of 200 to 250° C. As the wafer 600 is heated to a predetermined temperature, the bump formed of the solder on the wafer 600 is melted, and a reflow process S40 of planarizing the surface thereof is performed. Here, in particular, when the used substrate is a substrate obtained by attaching a plurality of substrates, it is important to determine a heat-resistant upper limit temperature within a range in which no delamination or cracking occurs in the substrate in consideration of a heat-resistant temperature of the adhesive agent or strength of the substrate.

Heating Adjustment Process (S50)

In the reflow process S40, in order to securely melt the adhesive agent or the solder formed on the wafer 600 and protect the substrate, excessive heating should be suppressed. In order to adjust a movement amount of heat from the heater 463 to the wafer 600, it is effective to adjust thermal conductivity using the gas near the wafer 600. This is because a radiant heat amount from the heater 463 is small due to a relatively low temperature at which the reflow process is performed. In addition, this is because the amount of the radiant heat radiated from the planar heater to the wafer does not highly depend on the distance between the heater and the wafer.

In order to adjust the thermal conductivity, adjustment of the distance between the heater 463 and the wafer 600, regulation of the pressure in the processing chamber 445 and adjustment of the kind/concentration of the gas are effective.

In addition, in order to securely melt the adhesive material or the solder formed on the wafer 600 in the reflow process S40, a soak time may be provided. The soak time is a time in which a predetermined temperature is maintained. The predetermined temperature is adjusted to be a melting point of the solder or more and a heat-resistant temperature of the substrate or less. Here, it is effective if the adjustment is the above-mentioned method of adjusting the thermal conductivity.

Cooling Process (S60)

When the reflow process is terminated, the distance between the wafer 600 (the front end of the lifter pin 413) and the susceptor table 411 is adjusted to the first distance. In addition, supply of the gas is stopped, and the inside of the processing chamber 445 becomes a vacuum atmosphere to lower the temperature of the wafer 600. Here, as preparation of unloading the substrate, the gas may be substituted with the inert gas.

In addition, supply of the gas may be stopped in the cooling process S60, and the inert gas or the gas having good thermal conductivity (to be described below) may be supplied after the inside of the processing chamber 445 is vacuum-exhausted. In addition, the vacuum exhaust and the supply of the gas may be alternately performed. As the vacuum exhaust and the gas supply are performed, the heated gas present in the processing chamber 445 can be removed, and thus a cooling time of the substrate can be reduced. In addition, the heated gas can be removed by a member in the processing chamber 445, and thus the cooling time can be reduced.

Substrate Unloading Process (S70)

When a decrease in temperature of the wafer 600 is terminated, the wafer is unloaded in a reversed sequence of the above-mentioned substrate loading process S10.

(3) Oxide Layer Removal Process (S30)/Reflow Process (S40)/Heating Adjustment Process (S50)

Next, detailed sequences of the oxide layer removal process S30 and the reflow process S40 will be described with reference to FIGS. 7, 8 and 9.

Figure 7:
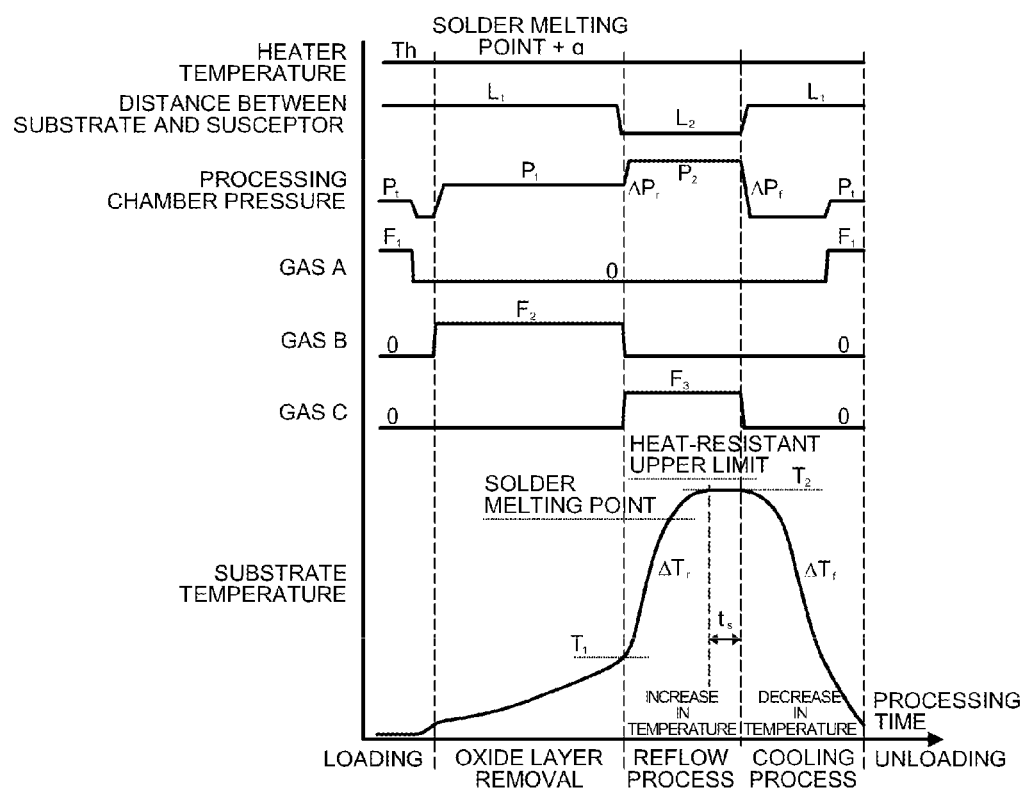
FIG. 7 is a view showing a sequence example upon substrate processing according to the embodiment of the present invention.

As shown in FIG. 7, when the wafer 600 is loaded into the processing chamber 445, the temperature of the heater 463 is set to Th. The distance between the wafer 600 (the substrate) (the front end of the lifter pin 413) and the susceptor table 411 (the susceptor) is set to the first distance $L_1$. A gas A (the inert gas) is supplied into the processing chamber 445 at a flow rate of $F_1$, and a pressure in the processing chamber 445 is set to $P_t$. When the wafer 600 is supported by the wafer support pin 414 and the gate valve is closed, supply of the gas A is stopped and the vacuum exhaust is performed. Then, the oxide layer removal process S30 is started.

In the oxide layer removal process S30, the reducing gas serving as a gas B is supplied into the processing chamber 445. The reducing gas is, for example, hydrogen ($H_2$) gas. The gas B is supplied to adjust the pressure in the processing chamber 445 to $P_1$. The distance between the substrate and the susceptor is maintained at the first distance $L_1$. When the pressure in the processing chamber 445 is stabilized, a high frequency is supplied from the high frequency power supply 444 to the resonance coil 432 and the gas B in the processing chamber 445 is excited to generate plasma. The solder formed on the wafer 600 by the excited gas B (the reducing plasma) and the oxide film formed on the metal film (the conductive film) adjacent to the solder are reduced/removed according to circumstances. After the plasma is generated for a predetermined time, supply of the high frequency power and supply of the gas B are stopped to terminate the oxide layer removal process S30. After the oxide layer removal process S30 is terminated, the reflow process S40 is started.

The solder formed on the wafer 600 should be securely melted. In addition, in order to protect the substrate, excessive heating or abrupt heating should be avoided. While a melting point of the solder is different according to the kind of solder, the melting point is less than about 250° C. Accordingly, a temperature at which the substrate arrives upon reflow should be 250° C. or less, and heating to 250° C. or more is not preferable. When such heating is performed using a general heater structure having a large heat capacity, as a set temperature of the heater is constantly held at a melting point +α of the solder and a movement amount of the heat from the heater to the substrate is adjusted, the substrate temperature may be saturated at a predetermined temperature. Meanwhile, the temperature of +α may be set in consideration of the movement amount of the heat from the heater to the substrate. For example, the temperature is within a range of, for example, about 0° C. to 100° C. When the temperature of the heater is within such a temperature range, since the radiation amount of the heat from the heater is small, it is effective to adjust a heat flux via the gas present around the heater and the substrate.

Specifically, a gas C is supplied at a flow rate $F_3$, and the pressure in the processing chamber 445 is adjusted to $P_2$. In addition, the lifter pin 413 is lowered such that the distance between the substrate (the front end of the lifter pin 413) and the susceptor becomes the second distance $L_2$. The second distance $L_2$ may be adjusted within a range of, for example, about 0.5 mm to 5 mm, and the gas may be disposed between the substrate and the susceptor. More preferably, the distance is a distance at which a gas flow is generated between the substrate and the susceptor. As the pressure is increased as described above and the distance between the substrate (the front end of the lifter pin 413) and the susceptor is the second distance, the temperature of the substrate can be increased. In addition, here, when the gas C is a gas having good thermal conductivity, uniformity of the substrate temperature can be improved. For example, the gas may be hydrogen ($H_2$) gas, helium (He) gas, neon (Ne) gas, and so on having high thermal conductivity. In addition, here, while the second distance $L_2$ is set to a distance at which the substrate does not come in contact with the susceptor, when an amount of foreign substances or a damage amount of the substrate generated due to the contact between the substrate and the susceptor is within an allowable range or there is no damage of the substrate due to abrupt heating, and so on, the substrate and the susceptor may be heated while in contact.

In addition, preferably, the thermal conductivity is adjusted to become first thermal conductivity in the above-mentioned oxide layer removal process S30, and second thermal conductivity in the reflow process S40. Here, the first thermal conductivity is adjusted to be smaller than the second thermal conductivity.

Adjustment of the thermal conductivity is performed by supplying gases having different thermal conductivities in the processes. For example, hydrogen and argon are supplied in the oxide layer removal process, and hydrogen and helium are supplied in the reflow process. Alternatively, hydrogen and argon are supplied in both of the processes, a ratio of the argon gas is high in the oxide layer removal process, a ratio of the hydrogen gas is high in the reflow process, and thus the second thermal conductivity can be increased to be larger than the first thermal conductivity.

In addition, as the pressure in the reflow process is increased to be higher than that in the oxide layer removal process, the second thermal conductivity can be increased to be higher than the first thermal conductivity.

Figure 8:
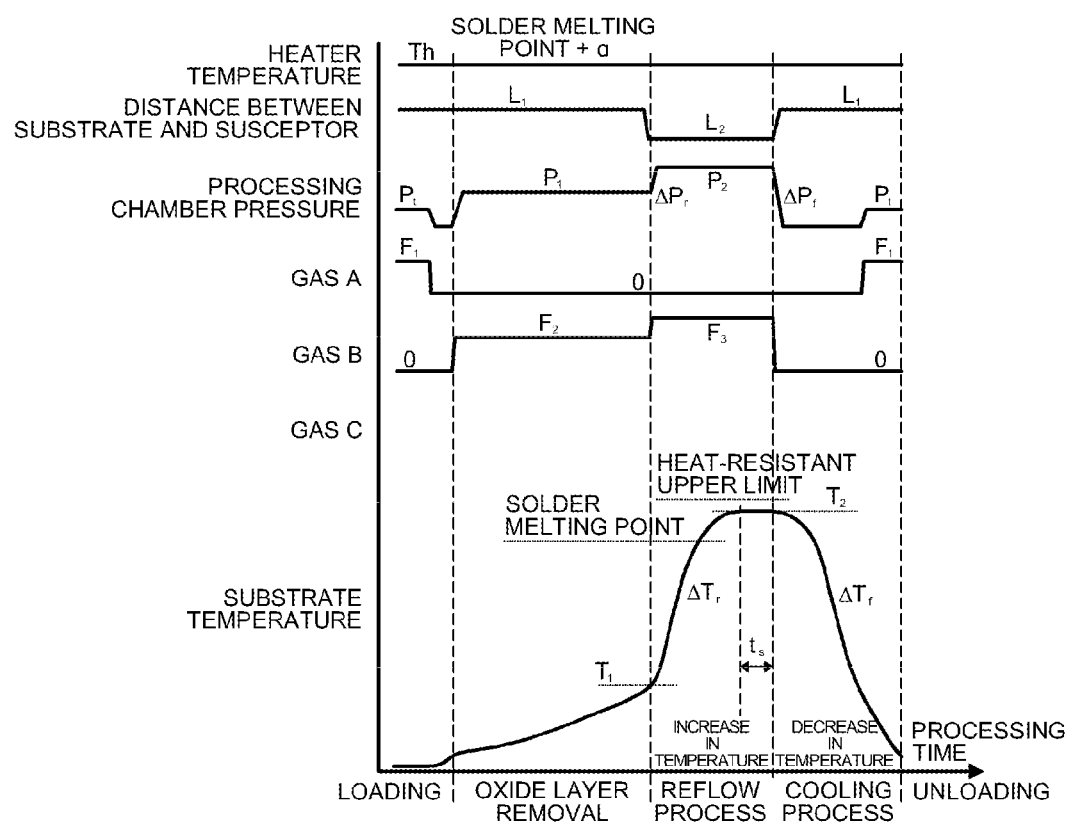
FIG. 8 is a view showing a sequence example upon substrate processing according to a second embodiment of the present invention.
Figure 9:
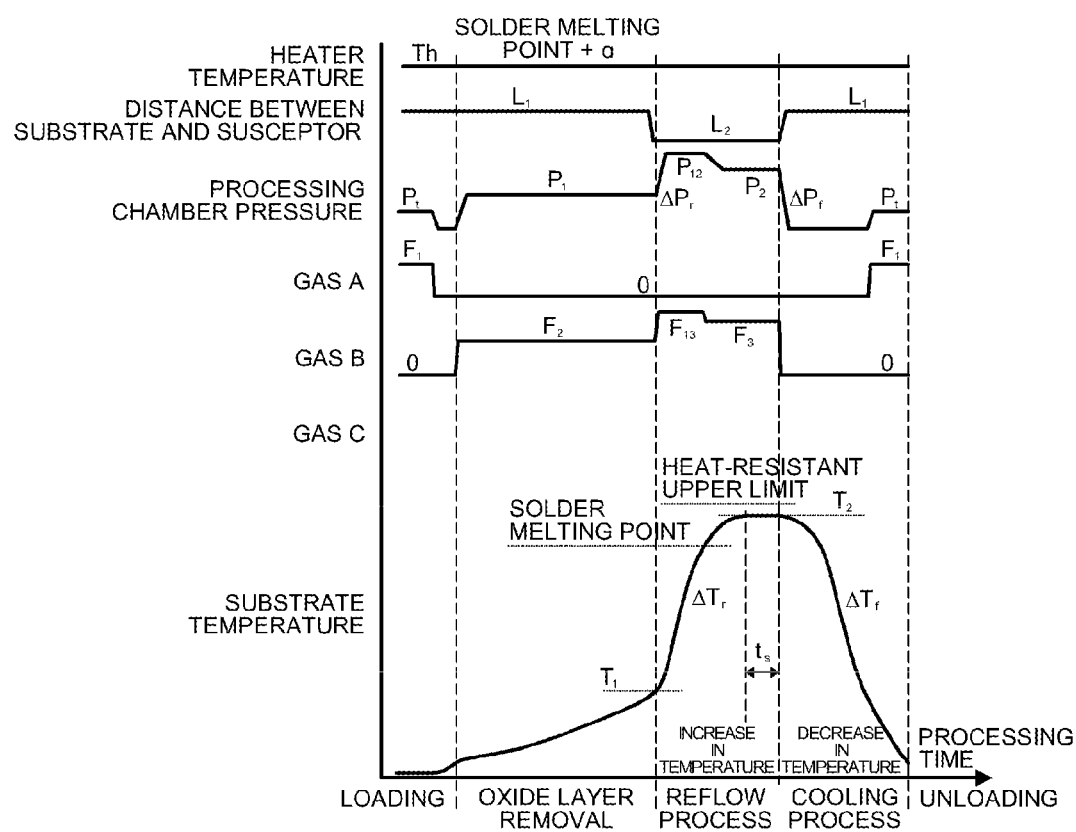
FIG. 9 is a view showing the sequence example of the substrate processing according to the second embodiment of the present invention.

In addition, here, while the example in which the gas B is substituted with the gas C in the reflow process has been presented, the embodiment is not limited thereto and, as shown in FIG. 8, even in the reflow process, the gas B (the reducing gas) similar to the oxide layer removal process may be supplied as it is. As the reducing gas is continuously supplied, adsorption of oxygen to the substrate can be prevented.

In addition, in order to adjust a temperature raising/lowering profile of the substrate temperature, the pressure, the gas flow rate and the second distance $L_2$ when the substrate temperature is in an excessive state may be adjusted. For example, as shown in FIG. 9, a speed of a variation $\Delta_r$ and $\Delta P_f$ in pressure upon an increase/decrease in temperature may be adjusted, and the pressure may be adjusted by being held at another pressure $P_{12}$ and then held at the final pressure $P_2$.

As described above, as the heat flux to the substrate via the gas is controlled, a temperature increase property, a saturation temperature and a temperature decrease property of the substrate can be controlled to arbitrary properties.

(4) Effects According to the Embodiment

According to the embodiment, one or a plurality of effects described below are provided.

(a) According to the embodiment, the natural oxide film of the solder can be removed.

(b) In addition, fine roughness formed on the surface of the solder can be removed to planarize the surface of the solder.

(c) In addition, as the distance between the substrate (the front end of the lifter pin) and the susceptor is adjusted in the oxide layer removal process and the reflow process, the solder can be securely melted and damage to the substrate can be prevented.

(d) In addition, thermal stress to the substrate can be suppressed.

(e) In addition, as the reducing plasma processing is performed, reducing processing can be performed in a state in which the temperature of the substrate is low.

(f) In addition, even when the substrate in the dice state is processed, the plurality of dies can be uniformly processed.

(g) In addition, even when the substrate in the dice state is processed, the plurality of dies placed on the support substrate can be uniformly processed without deviating.

(h) In addition, as the reducing gas is continuously supplied until the oxide layer removal process to the reflow process are terminated, adsorption of oxygen to the substrate can be prevented.

(i) In addition, as the substrates are adjusted to be held at different pressures in the reflow process and then held at the final pressure, a temperature increase speed of the substrate can be increased.

(j) In addition, as the distance between the substrate (the front end of the lifter pin) and the susceptor is increased to be larger than the second distance in the cooling process, cooling of the substrate can be accelerated.

(k) In addition, as supply of the gas supplied in the reflow process is stopped in the cooling process and the vacuum exhaust is performed, cooling of the substrate can be accelerated.

(l) In addition, as the heat flux to the substrate via the gas is controlled in the cooling process, abrupt cooling of the substrate can be prevented.

(m) As the inside of the load lock chamber and the transfer module becomes the inert gas atmosphere, adsorption of oxygen to the substrate can be suppressed.

Another Embodiment of the Invention

While the embodiment of the present invention has been described above in detail, the present invention is not limited to the above-mentioned embodiment but various modifications may be made without departing from the spirit of the present invention.

The present invention is characterized in that the temperature increase property and the temperature decrease property of the substrate are controlled to desired properties by adjusting the atmosphere in the reaction chamber in the heating process of the bump reflow processing and controlling the heat flux to the substrate via the gas, and the scope of the present invention is not limited by a plasma generating method, the number of substrates that are simultaneously processed, a direction in which the substrate is held, a processing temperature of the substrate, a shape of the substrate processing chamber or the heater, and so on.

For example, while the plasma generating method using the resonance coil has been described in the embodiment, the method may be a plasma generating method using microwaves, or may be a plasma generating method by parallel flat electrodes.

In addition, the present invention may be applied when film-forming processing of forming various films such as an oxide film, a nitride film, a metal film or the like, using a chemical vapor deposition (CVD) method, an atomic layer deposition (ALD) method, a physical vapor deposition (PVD), or the like, and may also be applied when other substrate processing such as plasma processing, diffusion processing, annealing processing, oxidation processing, nitration processing, lithography processing or the like is performed. In addition, the present invention may be applied to, in addition to the thin-film-forming apparatus, another substrate processing apparatus such as an etching apparatus, an annealing processing apparatus, an oxidation processing apparatus, a nitration processing apparatus, an exposure apparatus, an application apparatus, a mold apparatus, a development apparatus, a dicing apparatus, a wire bonding apparatus, a drying apparatus, a heating apparatus, an inspection apparatus and so on.

In addition, the present invention is not limited to the semiconductor manufacturing apparatus for processing a semiconductor wafer such as the substrate processing apparatus according to the embodiment, but may be applied to a substrate processing apparatus such as a liquid crystal display (LCD) manufacturing apparatus for processing a glass substrate, a solar cell manufacturing apparatus or the like.

According to the method of manufacturing the semiconductor device, the substrate processing apparatus and the recording medium of the present invention, reflow processing with high quality can be performed.

Preferred Embodiments of the Invention

Hereinafter, preferred embodiments according to the present invention are supplementarily noted.

<Supplementary Note 1>

According to an aspect of the present invention, there is provided a method of manufacturing a semiconductor device including:

(a) a reducing step including: (a-1) placing a substrate including a solder on a substrate supporting pin installed in a processing chamber, (a-2) supplying a reducing gas into the processing chamber, (a-3) adjusting a distance between a front end of the substrate supporting pin and a susceptor table to a first distance and heating the substrate to a first temperature and (a-4) exciting the reducing gas; and (b) a reflow step including: (b-1) supplying a thermally conductive gas into the processing chamber and (b-2) adjusting the distance between the front end of the substrate supporting pin and the susceptor table to a second distance and heating the substrate to a second temperature.

<Supplementary Note 2>
In the method of supplementary note 1, preferably, the first distance is longer than the second distance.
<Supplementary Note 3>
In the method of any one of supplementary notes 1 through 2, preferably, the first temperature is lower than the second temperature.
<Supplementary Note 4>
In the method of any one of supplementary notes 1 through 3, preferably, the first temperature is lower than melting point of the solder and the second temperature is equal to or higher than the melting point of the solder.
<Supplementary Note 5>
In the method of supplementary note 4, preferably, the second temperature is equal to or higher than the melting point of the solder and is lower than a temperature at which the substrate is damaged.
<Supplementary Note 6>
According to another aspect of the present invention, there is provided a method of manufacturing a semiconductor device including:
(a) placing a substrate on a substrate supporting unit installed in a processing chamber, the substrate having at least two substrates attached by at least one of an adhesive and a solder;
(b) supplying a process gas into the processing chamber;
(c) adjusting a position of the substrate supporting unit and heating the substrate by a heater;
(d) adjusting an inner pressure of the processing chamber;
(e) exciting the process gas; and
(f) controlling an amount of thermal conduction by the process gas to the substrate by adjusting the inner pressure of the processing chamber.
<Supplementary Note 7>
In the method of supplementary note 6, preferably, a flow rate and a concentration of the process gas are controlled in (c) depending on a temperature of the substrate.
<Supplementary Note 8>
In the method of any one of supplementary notes 6 through 7, preferably, each of the at least two substrates includes one of a polished silicon substrate and a support glass substrate.
<Supplementary Note 9>
In the method of any one of supplementary notes 6 through 8, preferably, at least one of the at least two substrates includes a substrate having a die placed thereon.
<Supplementary Note 10>
In the method of any one of supplementary notes 6 through 9, preferably, a load lock chamber in an inert gas atmosphere is disposed adjacent to the processing chamber, and the substrate is loaded into and unloaded from the processing chamber via the load lock chamber.
<Supplementary Note 11>
In the method of any one of supplementary notes 6 through 10, preferably, the solder is heated by the excited process gas and the substrate is cooled by the process gas in (e).
<Supplementary Note 12>
According to still another aspect of the present invention, there is provided a substrate processing apparatus including:
substrate supporting pin supporting a substrate including a solder and installed in a processing chamber;
gas supply unit configured to supply at least one of a reducing gas and a thermally conductive gas into the processing chamber;
an exciting unit configured to excite the reducing gas;
a susceptor table in which a heater heating the substrate is installed; and
a control unit configured to control the substrate supporting pin, the gas supply unit and the exciting unit to perform:
(a) adjusting a distance between a front end of the substrate supporting pin and the susceptor table to a first distance, heating the substrate to a first temperature and exciting the reducing gas; and
(b) adjusting the distance between the front end of the substrate supporting pin and the susceptor table to a second distance, heating the substrate to a second temperature and supplying the thermally conductive gas.
<Supplementary Note 13>
In the substrate processing apparatus of supplementary note 12, preferably, the first temperature is lower than the second temperature.
<Supplementary Note 14>
In the substrate processing apparatus of any one of supplementary notes 12 through 13, preferably, the first temperature is lower than melting point of the solder and the second temperature is equal to or higher than the melting point of the solder.
<Supplementary Note 15>
In the substrate processing apparatus of supplementary note 14, preferably, the second temperature is equal to or higher than the melting point of the solder and is lower than a temperature at which the substrate is damaged.
<Supplementary Note 16>
According to still another aspect of the present invention, there is provided a substrate processing apparatus including:
a processing chamber configured to process a substrate having at least two substrates attached by at least one of an adhesive and a solder;
a substrate supporting unit supporting the substrate and installed in the processing chamber;
a gas supply unit configured to supply a process gas into the processing chamber;
a heater configured to heat the substrate;
a pressure adjustment unit configured to adjust an inner pressure of the processing chamber;
an exciting unit configured to excite the process gas; and
a control unit configured to control an amount of thermal conduction by the process gas to the substrate by adjusting the inner pressure of the processing chamber.
<Supplementary Note 17>
In the substrate processing apparatus of supplementary note 16, preferably, the control unit is configured to control a flow rate and a concentration of the process gas while heating the substrate depending on a temperature of the substrate.
<Supplementary Note 18>
In the substrate processing apparatus of any one of supplementary notes 16 through 17, preferably, each of the at least two substrates includes one of a polished silicon substrate and a support glass substrate.
<Supplementary Note 19>
In the substrate processing apparatus of any one of supplementary notes 16 through 18, preferably, at least one of the at least two substrates includes a substrate having a die placed thereon.
<Supplementary Note 20>
The substrate processing apparatus of any one of supplementary notes 16 through 19 preferably further includes a load lock chamber in an inert gas atmosphere disposed adjacent to the processing chamber, and the substrate is preferably loaded into and unloaded from the processing chamber via the load lock chamber.

<Supplementary Note 21>

In the substrate processing apparatus of any one of supplementary notes 16 through 20, preferably, the control unit configured to control the gas supply unit, the exciting unit and the pressure adjustment unit to perform: heating the at least one of the adhesive and the solder by the excited process gas and cooling the substrate by the process gas while exciting the process gas.

<Supplementary Note 22>

The substrate processing apparatus of any one of supplementary notes 16 through 21 preferably further includes a first exhaust chamber and a second exhaust chamber disposed at a front end of the pressure adjustment unit.

<Supplementary Note 23>

According to still another aspect of the present invention, there is provided a program for causing a computer to perform:

(a) a reducing sequence including: (a-1) placing a substrate including a solder on a substrate supporting pin installed in a processing chamber, (a-2) supplying a reducing gas into the processing chamber, (a-3) adjusting a distance between a front end of the substrate supporting pin and a susceptor table to a first distance and heating the substrate to a first temperature and (a-4) exciting the reducing gas; and (b) a reflow sequence including: (b-1) supplying a thermally conductive gas into the processing chamber, (b-2) adjusting the distance between the front end of the substrate supporting pin and the susceptor table to a second distance and heating the substrate to a second temperature.

<Supplementary Note 24>

According to still another aspect of the present invention, there is provided a program for causing a computer to perform:

(a) placing a substrate on a substrate supporting unit installed in a processing chamber, the substrate having at least two substrates attached by at least one of an adhesive and a solder;

(b) supplying a process gas into the processing chamber;

(c) adjusting a position of the substrate supporting unit and heating the substrate by a heater;

(d) adjusting an inner pressure of the processing chamber;

(e) exciting the process gas; and (f) controlling an amount of thermal conduction by the process gas to the substrate by adjusting the inner pressure of the processing chamber.

<Supplementary Note 25>

According to still another aspect of the present invention, there is provided a non-transitory computer-readable recording medium storing a program for causing a computer to perform:

(a) a reducing sequence including: (a-1) placing a substrate including a solder on a substrate supporting pin installed in a processing chamber, (a-2) supplying a reducing gas into the processing chamber, (a-3) adjusting a distance between a front end of the substrate supporting pin and a susceptor table to a first distance and heating the substrate to a first temperature and (a-4) exciting the reducing gas; and (b) a reflow sequence including: (b-1) supplying a thermally conductive gas into the processing chamber, (b-2) adjusting the distance between the front end of the substrate supporting pin and the susceptor table to a second distance and heating the substrate to a second temperature.

<Supplementary Note 26>

According to still another aspect of the present invention, there is provided a non-transitory computer-readable recording medium storing a program for causing a computer to perform:

(a) placing a substrate on a substrate supporting unit installed in a processing chamber, the substrate having at least two substrates attached by at least one of an adhesive and a solder;

(b) supplying a process gas into the processing chamber;

(c) adjusting a position of the substrate supporting unit and heating the substrate by a heater;

(d) adjusting an inner pressure of the processing chamber;

(e) exciting the process gas; and (f) controlling an amount of thermal conduction by the process gas to the substrate by adjusting the inner pressure of the processing chamber.

<Supplementary Note 27>

According to still another aspect of the present invention, there is provided a method of manufacturing a semiconductor device including:

(a) placing a substrate on a substrate supporting unit installed in a processing chamber, the substrate having thereon a solder with an oxygen-containing film on a surface thereof;

(b) removing the oxygen-containing film by supplying a reducing gas into the processing chamber while maintaining a thermal conductivity of an inner atmosphere of the processing chamber at a first thermal conductivity; and (c) melting the solder by supplying a thermally conductive gas into the processing chamber while maintaining the thermal conductivity of the inner atmosphere of the processing chamber at a second thermal conductivity.

<Supplementary Note 28>

In the method of supplementary note 27, preferably, the second thermal conductivity is higher than the first thermal conductivity.

<Supplementary Note 29>

In the method of any one of supplementary notes 27 through 28, preferably, a thermal conductivity between the substrate supporting unit and the substrate is maintained at the first thermal conductivity while the substrate is mounted on the substrate supporting unit in (b), the thermal conductivity between the substrate supporting unit and the substrate is maintained at the second thermal conductivity while the substrate is mounted on the substrate supporting unit in (c), and a distance between the substrate supporting unit and the substrate in (c) is longer than that in (b).

<Supplementary Note 30>

According to still another aspect of the present invention, there is provided a method of manufacturing a semiconductor device including:

(a) placing a substrate on a substrate supporting unit installed in a processing chamber, the substrate having thereon a solder with an oxygen-containing film on a surface thereof;

(b) removing the oxygen-containing film by supplying a reducing gas to the substrate while maintaining a thermal conductivity of an inner atmosphere of the processing chamber at a first thermal conductivity; and (c) melting the solder by supplying a thermally conductive gas to the substrate while maintaining the thermal conductivity of the inner atmosphere of the processing chamber at a second thermal conductivity higher than the first thermal conductivity.

<Supplementary Note 31>

According to still another aspect of the present invention, there is provided a method of manufacturing a semiconductor device including:

(a) placing a substrate on a substrate supporting unit installed in a processing chamber, the substrate having thereon a solder with an oxygen-containing film on a surface thereof;

(b) removing the oxygen-containing film by supplying a reducing gas to at least one of a back surface and a front surface of the substrate while maintaining a thermal conductivity of an inner atmosphere of the processing chamber at a first thermal conductivity; and (c) melting the solder by supplying a thermally conductive gas to at least one of the back surface and the front surface of the substrate while maintaining the thermal conductivity of the inner atmosphere of the processing chamber at a second thermal conductivity.

<Supplementary Note 32>

In the method of any one of supplementary notes 1 through 5, preferably, a flow rate of the thermally conductive gas is controlled in (b) so as to maintain a temperature of the substrate at a predetermined temperature.

<Supplementary Note 33>

The method of any one of supplementary notes 1 through 5 preferably further includes cooling the substrate after (b) by removing the thermally conductive gas supplied in (b).

Accordingly, manufacturing quality of the semiconductor device can be improved, and manufacturing throughput can be improved.

What is claimed is:

1. A method of manufacturing a semiconductor device comprising:

(a) placing a substrate on a substrate supporting unit installed in a processing chamber, the substrate having thereon a solder with an oxygen-containing film on a surface thereof;

(b) reducing the oxygen-containing film by supplying a reducing gas and an additive gas having a thermal conductivity different from that of the reducing gas into the processing chamber while maintaining a thermal conductivity of an inner atmosphere of the processing chamber at a first thermal conductivity; and (c) melting the solder by supplying the reducing gas as a thermally conductive gas and the additive gas into the processing chamber while maintaining the thermal conductivity of the inner atmosphere of the processing chamber at a second thermal conductivity higher than the first thermal conductivity, wherein a ratio of the reducing gas to the additive gas in (c) is greater than a ratio of the reducing gas to the additive gas in (b).

2. The method of claim 1, wherein a flow rate of the thermally conductive gas is controlled in (c) so as to maintain a temperature of the substrate at a predetermined temperature.

3. The method of claim 1, wherein a distance between a front end of a lifter pin of the substrate supporting unit and a top surface of the substrate supporting unit is adjusted to a first distance in (b), and the distance between the front end of the lifter pin and the top surface of the substrate supporting unit is adjusted to a second distance in (c).

4. The method of claim 3, wherein a temperature of the substrate is maintained at 250° C. or lower in (c), and the second distance ranges from 0.5 mm to 5 mm in (c).

5. The method of claim 3, wherein the first distance is longer than the second distance.

6. The method of claim 1, wherein (b) comprises subjecting the substrate to plasma processing while maintaining the substrate at a temperature lower than a melting point of the solder, and (c) comprises processing the substrate at a temperature higher than the melting point of the solder and lower than a temperature at which the substrate is damaged.

7. The method of claim 1, wherein the substrate supporting unit comprises a lifter pin and a heater, and each of (b) and (c) is performed with the substrate heated by the heater maintained at a predetermined temperature and placed on a front end of the lifter pin.

8. The method of claim 7, wherein the substrate is heated by thermal conduction of a gas near the heater and the substrate in (b) and (c).

9. The method of claim 1, wherein an inner pressure of the processing chamber when performing (c) is higher than that of the processing chamber when performing (b).

10. A non-transitory computer-readable recording medium storing a program for causing a computer to perform:

(a) placing a substrate on a substrate supporting unit installed in a processing chamber, the substrate having thereon a solder with an oxygen-containing film on a surface thereof;

(b) reducing the oxygen-containing film by supplying a reducing gas and an additive gas having a thermal conductivity different from that of the reducing gas into the processing chamber while maintaining a thermal conductivity of an inner atmosphere of the processing chamber at a first thermal conductivity; and (c) melting the solder by supplying the reducing gas as a thermally conductive gas and the additive gas into the processing chamber while maintaining the thermal conductivity of the inner atmosphere of the processing chamber at a second thermal conductivity higher than the first thermal conductivity, wherein a ratio of the reducing gas to the additive gas in (c) is greater than a ratio of the reducing gas to the additive gas in (b).

11. The non-transitory computer-readable recording medium of claim 10, wherein (b) comprises subjecting the substrate to plasma processing while maintaining the substrate at a temperature lower than a melting point of the solder, and (c) comprises processing the substrate at a temperature higher than the melting point of the solder and lower than a temperature at which the substrate is damaged.

* * * * *